United States Patent [19]
Higashiyama

[11] Patent Number: 4,921,774
[45] Date of Patent: May 1, 1990

[54] PHOTO AND PRESSURE SENSITIVE RECORDING MEDIUM

[75] Inventor: Shunichi Higashiyama, Nagoya, Japan

[73] Assignee: Brother Kogyo Kabushika Kaisha, Japan

[21] Appl. No.: 323,337

[22] Filed: Mar. 14, 1989

[30] Foreign Application Priority Data

Feb. 3, 1987 [JP] Japan .................................. 62-24358
Mar. 20, 1987 [JP] Japan .................................. 62-66286
Apr. 28, 1987 [JP] Japan .................................. 62-105842

[51] Int. Cl.$^5$ .............................................. G03C 1/72
[52] U.S. Cl. ................................... 430/138; 430/395; 430/396; 430/496; 430/510
[58] Field of Search ............... 430/138, 395, 396, 496, 430/510

[56] References Cited

U.S. PATENT DOCUMENTS 3,912,510 10/1975 Marks .................................. 430/396
4,399,209 8/1983 Sanders et al. ...................... 430/138
4,440,846 4/1984 Sanders et al. ...................... 430/138

Primary Examiner—Richard L. Schilling
Assistant Examiner—Hoa Van Le
Attorney, Agent, or Firm—Kane, Dalsimer, Sullivan, Kurucz, Levy, Eisele and Richard

[57] ABSTRACT

The photo and pressure sensitive recording medium provided with a plurality of light permeable portions while the remaining portion thereof being light-shielded is disclosed. With this recording medium, a light can be projected through the recording medium onto a copy subject which is placed in close contact with the recording medium. The photosensitive surface of the recording medium is exposed to the light reflected from the copy subject and a latent image corresponding to the image fixed on the copy subject is formed on the recording medium.

9 Claims, 5 Drawing Sheets

PHOTO AND PRESSURE SENSITIVE RECORDING MEDIUM

This is a divisional Ser. No. 151,987, filed on Feb. 3, 1988, now abandoned.

BACKGROUND OF THE INVENTION

This invention relates to a photo and pressure sensitive recording medium, and a process for copying an image with said recording medium, and further to an apparatus for carrying out said copying process.

The photo and pressure sensitive recording medium, on which a latent image can be recorded in response to the projection of the corresponding optical image, has been proposed as disclosed in the U.S. Pat. Nos. 4399209 and 4440846. Such a recording medium generally consists of a carrier of film or paper, on whose surface photo-sensitive microcapsules are carried. For forming a latent image, there are several known ways to expose the above recording medium:

(1) The recording medium is closely attached to a positive text film or sheet, and the light is exposed onto the recording medium through the text.

(2) The recording medium is placed in opposition to a positive text film or sheet and a lens is disposed between the text and the recording medium. The light is exposed onto the recording medium through the text and the lens.

(3) The recording medium is placed in opposition to a text subject and a lens is disposed between the text subject and the recording medium. The light is projected onto the text surface and the microcapsules on the recording medium is exposed to the light reflected from the text surface.

In case of the above prior approaches (1) and (2), the text subject is required to be light-transmissive so that the text carrying information on both side thereof and/or the combined texts such as magazines could not be copied. On the other hand, in case of the approaches (2) and (3), the light would be attenuated while passing through the lens, and this makes it difficult to make full use of the light transmitted through or reflected from the text surface, which resulting in requiring a longer exposure time and therefore a longer time for copying operation.

SUMMARY OF THE INVENTION

It is therefore an object of the invention to provide an improved photo and pressure sensitive medium capable of forming a latent image thereon by projecting light therethrough onto the text surface which is placed in close contact with the recording medium.

Another object of the invention is to provide a copying process capable of shortening a time required for copying operation.

Other object of the invention is to provide a copying apparatus for carrying out said copying process.

A photo and pressure sensitive recording medium provided according to the invention comprises: a sheet-formed carrier and a plurality of photo-sensitive microcapsules each containing a first component to develop or change a color when reacted with another component and a second component to change rupturing strength of said microcapsule when light is exposed thereto, said microcapsules being coated on one surface of said carrier, the improvement which comprises in that a plurality of light permeable portions are provided on said carrier while the remaining portion on said carrier being light-shielded.

With the above recording medium, as the light is projected through the light permeable portions of the recording medium and the reflected light from the text surface can be used to expose the microcapsules on the recording medium if the recording medium is placed in close contact with the text subject, the light would not be so attenuated as in the prior arts and even the text carrying information on both sides thereof and/or the combined texts such as magazines could be copied.

In the meantime, as the microcapsules on the carrier are exposed to the light passed said carrier, the size of each light permeable portion of the recording medium should be determined so as not to affect the resolution of the obtained copy image. If the total area of the light permeable portions is small, however, the quality of the obtained image is lowered. Accordingly, it is desirable to form each light permeable portion to have the size of $300\mu m^2$ to $12000\mu m^2$, and the total area of all the light permeable portions should be 30% to 60%, and preferably 50% of the whole surface area of said carrier.

A copying process provided according to the invention uses the above proposed recording medium, which comprises: placing the side of said recording medium carrying said microcapsules in close contact with a subject, an image fixed on which is to be copied, with the side of said subject carrying said image facing said recording medium; projecting light toward said image on said subject from the side of said recording medium opposite to said side thereof facing said image to form a latent image on said recording medium; and rupturing said microcapsules with lower rupturing strength to develop a visible image.

A modified copying process provided according to the invention comprises: placing the side of a photo and pressure sensitive recording medium carrying the microcapsules in close contact with a subject, an image fixed on which is to be copied, with the side of said subject carrying said image facing said recording medium; placing a screen member in close contact with the side of the recording medium opposite to said side thereof facing said subject, said screen member being provided with a plurality of light permeable portions while the remaining portion on said screen member being light-shielded; projecting light toward said image on said subject from the side of said screen member opposite to said side thereof facing said recording medium to form a latent image on said recording medium; and rupturing said microcapsules with lower rupturing strength to develop a visible image.

With this modified copying process the prior photo and pressure sensitive recording medium can be used, since the light permeable portions are formed on the separate screen member.

A copying apparatus provided according to the invention comprises: placing means for placing a recording sheet in close contact with a subject, an image fixed on which is to be copied; light projecting means for projecting light toward said subject through said recording sheet while said recording sheet being in close contact with said subject; and rupturing means for rupturing said microcapsules with lower rupturing strength.

The above copying apparatus may have a movable tray member for moving and supporting the recording medium to and under the text subject, and if said movable tray member is formed of a screen member provided with a plurality of light permeable portions while the remaining portion thereof being light-shielded, the above modified copying process can also be carried out.

DESCRIPTION OF THE ACCOMPANYING DRAWINGS

DESCRIPTION OF THE PREFERRED EMBODIMENTS

Figure 1:
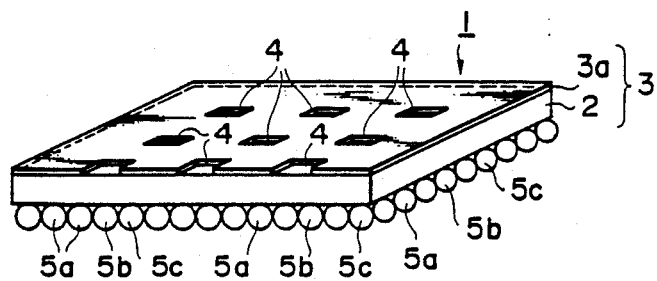
FIG. 1 is a perspective view of a recording medium embodying the invention.

FIG. 1 shows a photo and pressure sensitive recording medium 1 embodying the invention, which comprises a sheet-form carrier 3 and a plurality of photosensitive microcapsules 5a, 5b, 5c, coated thereon.

The sheet-form carrier 3 consists of a sheet 2 made of transparent or semi-transparent film such as PET (polyethylene telephtalate) and a shield layer 3a formed on the back of the sheet 2. The shield layer 3a offers its light shield effect through coating of carbon black or the like as visible light absorbing material. A binder for coating carbon black is, for instance, PVA (polyvinyl alcohol) or PMNA (polymethyl methacrylate). The shield layer 3a is further formed with dispersedly distributed light-transmitting areas 4.

The light-transmitting area 4 is formed as a through-aperture having an area of not less than 300μm² but not more than 12000μm². The distribution density of the light-transmitting areas 4 on the sheet-form carrier 3 is set to be such that the total area of the light transmitting areas 4 is not more than 60% but not less than 30%, and preferably 50% of the total surface area of the sheet-form carrier 3.

If the area of the through-aperture becomes less than 300μm², due to the diffusion of the light passed the through-apertures, the light transmitting areas 4 function merely for decreasing the quantity of the light. On the contrary, if the area exceeds 12000 μm², resolution of the obtained image decreases below the allowable one. When the light transmitting area is formed to have a round section, the diameter of which should be selected as being not less than 20μm but not more than 120μm.

If the distribution density of the light transmitting areas 4 becomes less than 30%, it takes relatively long time to obtain the allowable optical density on the obtained image. On the contrary, if the distribution density exceeds 60%, the black and white contrast of the obtained image becomes low.

The photo-sensitive microcapsules (simply referred to as "capsules" below) 5a, 5b, 5c contain therein known color developing agents (dye precursor) for yellow, magenta and cyan, photo-curable resin and photopolymerization initiators for the individual color components. Yellow capsules 5a allow the photo-curable resin therein to be set when exposed to blue light. If the yellow capsules 5a are not exposed to blue light, they are crushed when they are pressed together with a sheet carrying a developer such as organic acid (referred to as "developer sheet" below), not shown, to develop yellow color in reaction to the dye precursor squeezed out of the crushed capsules 5a.

Magenta capsules 5b allow the photo-curable resin therein to be set when exposed to green light, and cyan capsules 5c allow the photo-curable resin therein to be set when exposed to red light.

Figure 2:
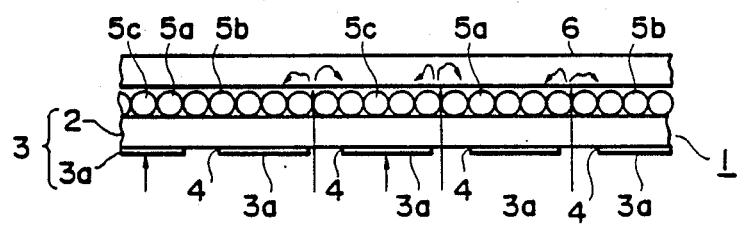
FIG. 2 is a section of the recording medium illustrated in FIG. 1 and showing the way to form a latent image thereon.

When an image on a text 6 is to be recorded above constructed recording medium 1, as illustrated in FIG. 2, the text 6 is closely attached to the surface of the recording medium 1 carrying the capsules 5a, 5b, 5c. When blue light then shines the shield layer 3a, the blue light passes through the light transmitting areas 4 to reach the text 6. The yellow capsules 5a, on the recording medium 1 closely attached to the parts of the text 6 where blue light is reflected from the surface of the text 6, are thus exposed to light to be photo-cured. On the other hand, photo-curing does not take place at the yellow capsules 5a on the recording medium 1 in close contact with the parts of the text 6 where blue light is absorbed.

Other capsules 5b and 5c are similarly exposed to light in accordance with the image on the text 6 by selectively projecting green and red light onto the shield layer 3a of the recording medium 1. The recording medium 1 is then laid on the developer sheet or the like member. The capsules 5a, 5b and 5c remaining uncured are now crushed so that the dye precursor squeezed out of the capsules is brought into developing reaction to the developing agent to build a corresponding image on the developer sheet.

The following table shows the results of the experiments in copying with the above recording medium 1.

TABLE

| Filter | Example | Comp. (1) | Comp. (2) |
|--------|---------|-----------|-----------|
| RED    | 0.4 sec | 14 sec    | 45 sec    |
| GREEN  | 0.4     | 11        | 30        |
| BLUE   | 0.1     | 4.2       | 12        |
| LAMP   | 100 W/1 | 100 W/1   | 500 W/2   |

The above experiments have been carried out with the recording medium consisting of a Polyestel film sheet of 25μm thickness with the photo-permeability of 50%. One side of the sheet is coated with microcapsules having the diameters of 2 to 8μm, average 5μm. The thickness of the capsule coating is 10μm. The other side thereof is masked with the black carbon sheet to be light-shielded. As the light transmitting areas, through-apertures each having a round section of the diameter of 116μm is distributed on the carbon sheet with the distribution density of 30625 apertures/inch² (i.e., the ratio of the total area of the light transmitting areas and that of the light shielding areas becomes 1 : 1).

As a copy subject, a black and white text with the contrast of 2.1 is used, and the light is projected to the text through the recording medium.

As the light source, 100W/500W halogen lamp is set at the position of 30cm from the text.

The recording medium on which a latent image is formed by the projection of the light is passed through a pair of pressing rollers together with the developer sheet. The pressure applied to the superposed sheets is 600kg/cm$^2$.

The experiments are repeated to obtain a visible image on the developer sheet having an optical density of 0.5 for the white portion (the optical density thereof is 0.2) on the text.

As the comparative example, a recording medium which is not provided with the carbon black layer is used. Further, the example of the prior exposure process (3) is carried out with the carbonless recording medium.

As apparent from the above table, the exposure time required to the present invention is decreased to around 3/100 of the comparative example (1) and around 1/100 of the comparative example (2).

Figure 3:
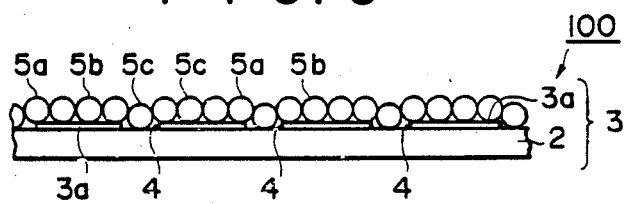
FIG. 3 is a section of a modified recording medium.

FIG. 3 shows a modified recording medium 100, the sheet-form carrier 3 is formed with a shield layer 3a with dispersedly distributed light-transmitting areas 4, on the surface of which the capsules 5a, 5b and 5c are coated.

Figure 4:
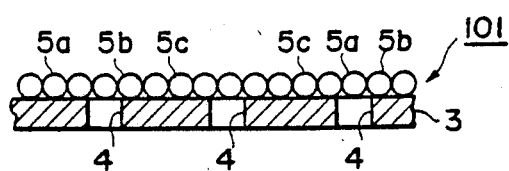
FIG. 4 is a section of a further modified recording medium.

FIG. 4 shows a further modified recording medium 101, wherein the sheet-form carrier 3 comprises an opaque paper or like material which are provided with through apertures distributed dispersedly over the sheet, serving as light-transmitting areas 4.

While in the first embodiment illustrated in FIG. 1, the shield layer 3a is formed by coating a shield agent, transparent silver photographic film or printing paper may be used with most of its surface blakened with dispersedly distributed areas remaining light-transmissive. Furthermore, while in the third embodiment illustrated in FIG. 4, capsules are carried on the opaque sheet-form carrier 3, the same effect may by obtained by the recording medium provided with a developer layer sandwiched between the carrier 3 and the capsules 5a, 5b and 5c, which consists of a coat of light-transmissive developing agent on the carrier 3. In this case, the capsules contain dye precursor, photo-curable resin and photo-polymerization initiator and the developing agent is of such a material as acid white clay, activated clay or organic acid which develops color in reaction to the dye precursor.

Now, copying process and apparatus by using the above described recording medium 1 is explained below with reference to FIGS. 5 through 9.

The color copying machine 11 comprises a cassette 9 storing the recording medium 1, a developer sheet cassette 10, a transport unit 12 for transporting the recording medium (referred to as "transport unit" below), an exposure unit 13, a pressing unit 14, and a separating unit 15.

The cassette 9 stores therein the recording medium 1 with its side coated with the capsules 5a facing downward. The recording medium 1 is drawn out of the cassette 9 by means of a pair of feed rollers 18 mounted around the outlet of the cassette 9. The transport unit 12 consists of a transparent glass plate 19 and an opaque glass plate 20 both located on the upper section of the machine 11, a fitting roller 21 and a holder roller 22 located between the both glass plates 19 and 20, and a receptacle 23 provided under the opaque glass plate 20, and feed rollers 24a and 24b mounted at the outlet end of the receptacle 23. The whole transport unit 12 is reciprocally movable between two positions shown in FIG. 5 and FIG. 7 by means of a drive unit not shown.

Figure 5:
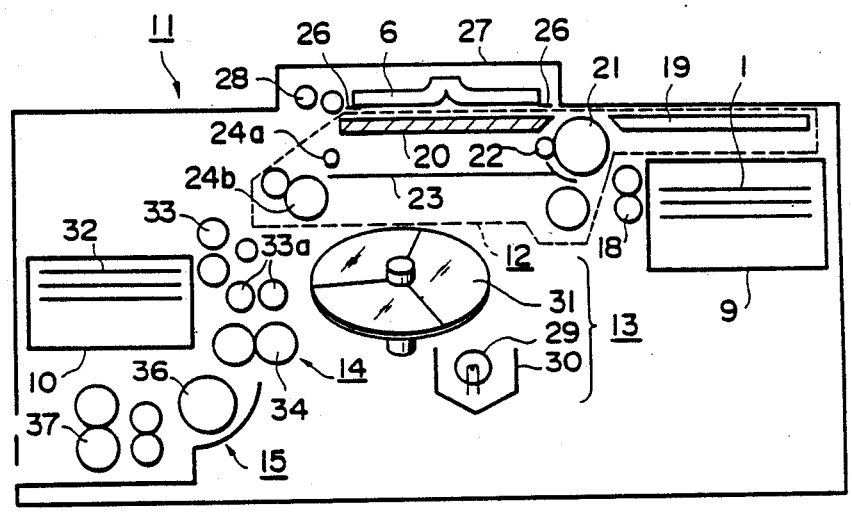
FIG. 5 is a schematic sectional view of a copying apparatus.
Figure 6:
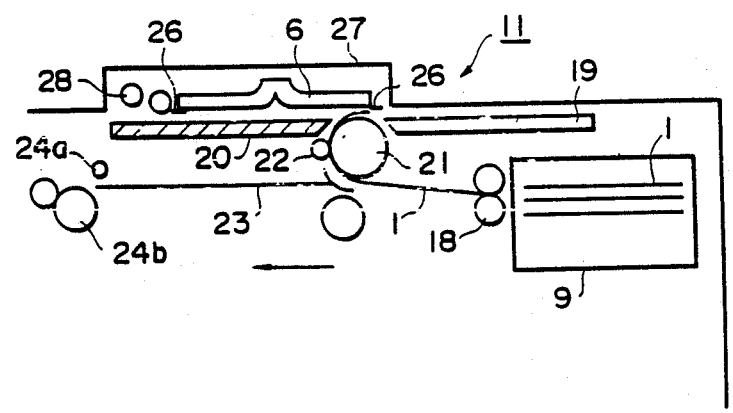
FIGS. 6 through 9 are schematic section views illustrating the operation of the apparatus shown in FIG. 5.
Figure 7:
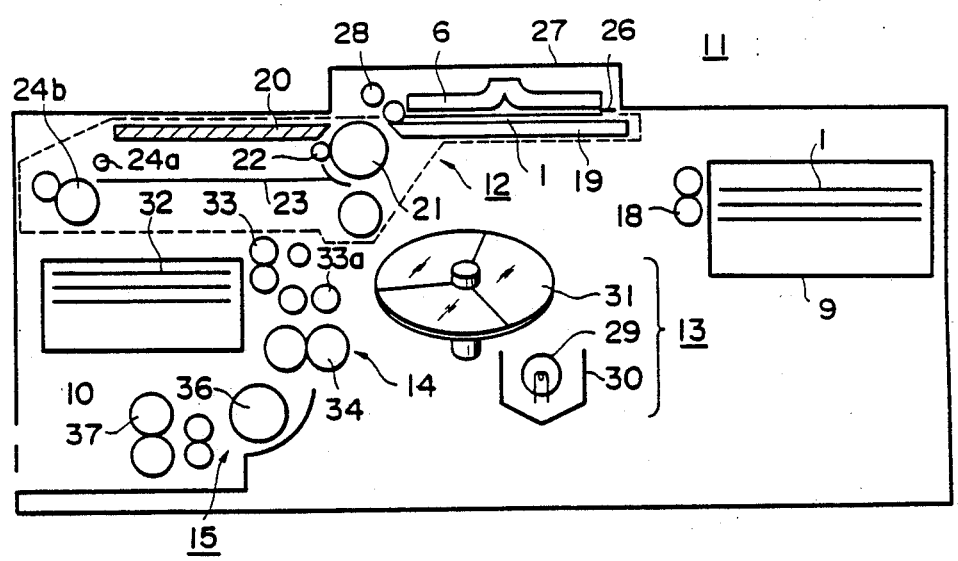
Figure 8:
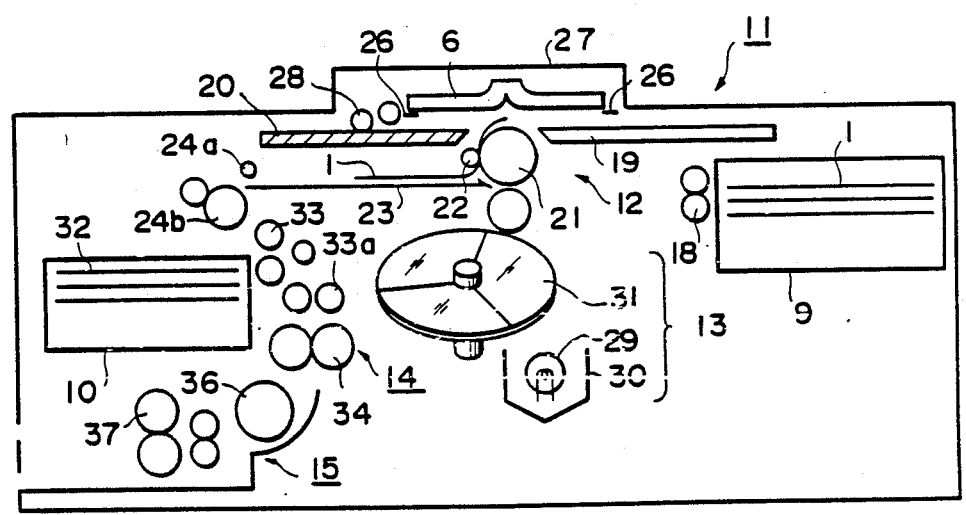
Figure 9:
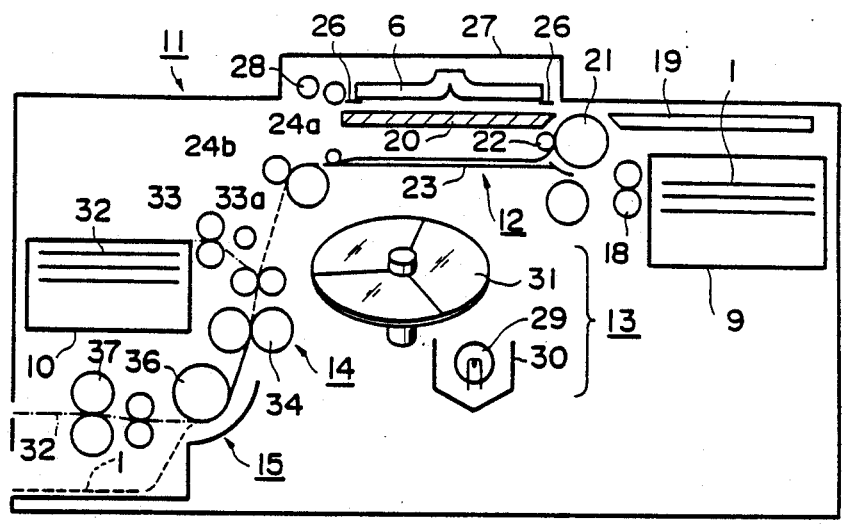

As shown in FIG. 5, the color copying machine 11 is further provided at its top portion above the opaque glass plate 20 of the transport unit 12 with a text carrying tray 26 on which a text, typically the book 6 in its opened state is shown to be placed with its inside pages facing downward.

A text holder 27 is provided to hold the text 6 carried on the text tray 26 in position by covering the top of the text 6. The text carrying tray 26 is provided at its outlet end with separator rollers 28 which separate the recording medium 1 which has been closely attached to the under surface of the text 6 from the text 6. Pressure unit 14 is arranged to destroy the capsules on the recording medium 1 which have not been exposed to light.

Exposure unit 13 comprises a visible light emitting lamp 29 covering the whole range of wavelengths from 400 to 700 nm such as halogen lamp and tungsten lamp, a reflector 30 for condensing the light emitted from the visible light emitting lamp 29 onto the text 6, and a filter unit 31 incorporating dichroic filters through which the light with the wavelength corresponding to red, green and blue is allowed to pas selectively so that the capsules containing cyan, magenta and yellow are photo-cured accordingly. The filter unit 31 is so rotated that the filter for each selected color is located above the visible light emitting lamp 29.

The developer sheet cassette 10 stores therein a known developer sheet 32 carrying a developing agent to react to the dye precursor from the capsules 5a, 5b and 5c, the developer sheet 32 being drawn out of the cassette 10 by means of feed rollers 33.

Pressure unit 14 consists of a pair of pressure rollers 34 which pressingly crush the unexposed capsules on the recording medium 1, thereby transferring the image onto the developer sheet 32 overlying the recording medium 1.

Separator unit 15 consists of a separator roller 36 for separating the recording medium 1 from the developer sheet 32 and a pair of heat rollers 37 between which the separated developer sheet 32 is passed.

The copying apparatus 11 arranged as described above is operated as explained below.

As shown in FIG. 5, with the text 6 placed on the text carrying tray 26 and held by the the holder 27 in position, the recording medium 1 is removed from the cassettes 9 by means of feed rollers 18. While feeding the recording medium 1 onto the transparent glass plate 19 by means of the fitting roller 21 and the holder roller 22, the transport unit 12 is moved from the position shown in FIG. 7. In this position, the recording medium 1 placed on the transparent glass 19 is brought into close contact with the under surface of the text 6. The lamp 29 now lights the blue, green and red dichroic filters above the shining lamp 29 so that blue, green and red light shines the shield layer of the recording medium 1. The transport unit 12 remains stationary during this illumination.

When the exposure unit completes its illuminating operation, the recording medium 1 is separated from the text 6 by means of the separator roller 28 to be conveyed to the receptacle 23 by the fitting roller 21 and the holder 22. The transport unit 12 is at this time moved from the position shown in FIG. 7 rightward, while the recording medium 1 is drawn out of the receptacle 23 by means of feed rollers 24a and 24b. At this time, the developer sheet 32 leaves the cassette 10 through the feed roller 33 and is laid vis-a-vis on the recording medium 1 by means of guide rollers 33a.

The recording medium 1 and developer sheet 32 are then passed together through the pressure unit 14. Under the pressure of this unit 14, the capsules ready for color development are crushed to transfer the developing agent (image) onto the developer sheet 32. The recording medium 1 and the developer sheet 32, after having passed through the pressure unit 14, are pulled apart from each other by the separator roller 36, and the developer sheet 32 is passed through the heat rollers 37 to set the color image thereon.

It should be noted that the above copying process can be applied to monochrome, two-color or similar copying requirements. The filter unit 31 may be eliminated by using a source of light with wavelengths which matches the colors on the recording medium 1, making only one exposure suffice the color image development.

In the meantime, the above described copying apparatus 11 can be adapted for the modified copying process by incorporating a screen plate instead of the above transparent glass plate 19.

More particularly, in the modified copying process, an ordinal photo and pressure sensitive recording medium 102, which is provided with light transmitting areas 4, is used instead of the above explained improved recording medium 1.

The screen plate consist of a sheet of transparent or semi-transparent film such as PET (polyethylene telephtalate), polyvinyl chloride, polyvinylidene chloride or glass, at least one side of which is formed with a light-shield layer 300a. The shield layer 300a offers its shield effect through coating of carbon black or the like as visible light absorbing material. A binder for coating carbon black may be for instance PVA (polyvinyl alcohol) or PMMA (polymethyl methacrylate). The shield layer 300a is further formed with dispersedly distributed light-transmitting areas 4 which are not coated with the shielding material.

Figure 10:
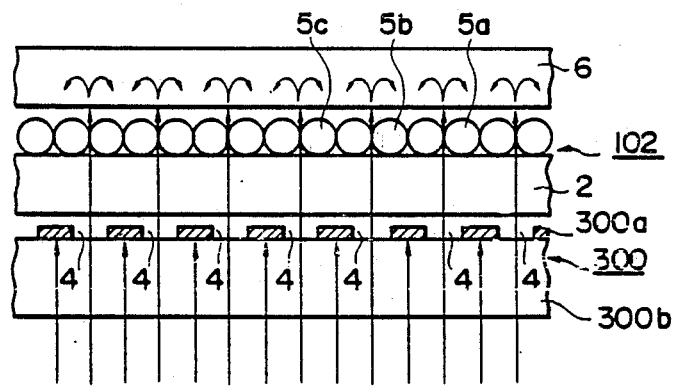
FIGS. 10 is a schematic diagram showing a screen member.

With the above described screen plate closely joined to the carrier 2 as illustrated in FIG. 10, when blue light shines the screen plate 300, the blue light passes through the light transmitting areas 4 to reach the text 6. The yellow capsules 5a on the recording medium 102 closely attached to the parts of the text 6 where blue light is reflected from the surface of the text 6, are thus exposed to light to be photo-cured. On the other hand, photo-curing does not take place at the yellow capsules 5a of the recording medium 102 in close contact with the parts of the text 6 where blue light is absorbed into the text 6.

Other capsules 5b and 5c are similarly exposed to light in accordance with the image on the text 6 by selectively projecting green and red light onto the screen plate 300. The recording medium 102 is then laid on the developer sheet to be pressed together by means of pressure rollers or the like means. The capsules 5a, 5b and 5c remaining unset are now crushed so that the dye precursor squeezed out of the capsules is brought into developing reaction to the developing agent to build a corresponding image on the developer sheet.

Figure 11:
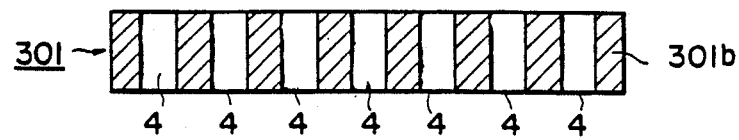
FIG. 11 is a section of a modified screen member.
Figure 12:
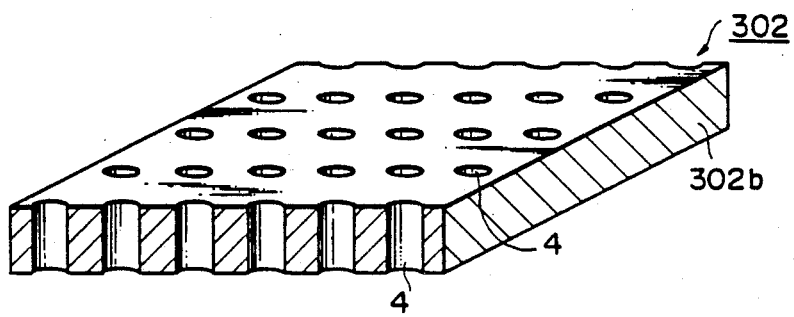
FIG. 12 shows an another screen member.

FIG. 11 shows a modification of the screen plate 301, where most of the sheet 301b may be opaque, and provided in itself with dispersedly distributed light transmitting areas 4. FIG. 12 shows a further modification of the screen plate 302 wherein the sheet 302b comprises an opaque paper, plastic or like material, which are provided with through-apertures distributed dispersedly over the sheet, serving as light-transmitting areas.

While in the embodiment illustrated in FIG. 10, the shield layer 300a is formed by coating a shield agent, transparent silver photographic film or printing paper may be used with most of its surface blackened with dispersedly distributed areas remaining light-transmissive.

What is claimed is:

1. A photo and pressure sensitive recording medium comprising a sheet-formed carrier and a plurality of photo-sensitive microcapsules each containing a first component to develop or change a color when reacted with another component and a second component to change rupturing strength of said microcapsule when light is exposed thereto, said microcapsules being coated on one surface of said carrier, the improvement which comprises in that a plurality of light permeable portions are provided on said carrier while the remaining portion on said carrier being light-shielded.

2. The recording medium according to claim 1 wherein said carrier is made of a light permeable material and said remaining portion is light-shielded by a light-absorbing substance coated thereon.

3. The recording medium according to claim 1 wherein said carrier comprises a photographic printing paper with black-colored portion serving as said light-shielded portion.

4. The recording medium according to claim 1 wherein said carrier comprises a silver photographic film with black-colored portion serving as said light-shielded portion.

5. The recording medium according to claim 1 wherein said carrier is made of an opaque substance provided with a plurality of through-holes serving as said light-permeable portions.

6. The recording medium according to claim 1 wherein each of said light permeable portions has a round section with the diameter of 20$\mu$m to 120$\mu$m.

7. The recording medium according to claim 1 wherein each of said light permeable portion has an area of 300$\mu m^2$ to 12000$\mu m^2$.

8. The recording medium according to claim 1 wherein total area of said light permeable portions is 30% to 60% of the whole surface area of said carrier.

9. The recording medium according to claim 8 wherein said total area is 50% of said whole surface area.

* * * * *